(12) United States Patent
Kato et al.

(10) Patent No.: US 11,315,797 B2
(45) Date of Patent: Apr. 26, 2022

(54) PLASMA ETCHING METHOD USING GAS MOLECULE CONTAINING SULFUR ATOM

(71) Applicant: KANTO DENKA KOGYO CO., LTD., Tokyo (JP)

(72) Inventors: Korehito Kato, Shibukawa (JP); Yoshinao Takahashi, Tokyo (JP); Mitsuharu Shimoda, Shibukawa (JP); Yoshihiko Iketani, Shibukawa (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 0 days.

(21) Appl. No.: 15/733,949

(22) PCT Filed: Jun. 21, 2019

(86) PCT No.: PCT/JP2019/024633
§ 371 (c)(1),
(2) Date: Dec. 1, 2020

(87) PCT Pub. No.: WO2019/245013
PCT Pub. Date: Dec. 26, 2019

(65) Prior Publication Data
US 2021/0233774 A1 Jul. 29, 2021

(30) Foreign Application Priority Data

Jun. 22, 2018 (JP) .............................. JP2018-119232

(51) Int. Cl.
*H01L 21/311* (2006.01)
*H01J 37/32* (2006.01)

(52) U.S. Cl.
CPC .. *H01L 21/31116* (2013.01); *H01L 21/31144* (2013.01); *H01J 37/3244* (2013.01); *H01J 2237/334* (2013.01)

(58) Field of Classification Search
None
See application file for complete search history.

(56) References Cited

U.S. PATENT DOCUMENTS

| 2015/0093915 A1 | 4/2015 | Reddy et al. |
| 2016/0307764 A1 | 10/2016 | Gupta et al. |

(Continued)

FOREIGN PATENT DOCUMENTS

| JP | H07211694 A | 8/1995 |
| JP | 2008244292 A | 10/2008 |

(Continued)

OTHER PUBLICATIONS

Kim et al., "Study on the etching characteristics of amorphous carbon layer in oxygen plasma with carbonyl sulfide", Journal of Vacuum Science & Technology A, Vacuum, Surfaces, and Films 31, pp. 1-8 (Jan. 2013).

(Continued)

*Primary Examiner* — Roberts P Culbert
(74) *Attorney, Agent, or Firm* — Browdy and Neimark, PLLC

(57) ABSTRACT

Provided is a plasma etching method that enables, in a semiconductor fabrication process, selective processing of a film consisting of a single material, such as $SiO_2$ or SiN, or a composite material of $SiO_2$ and SiN over a mask material as well as processing into satisfactorily vertical processed shapes. It is possible, for example, to enhance selectivity over a mask material or other materials excluding an etching target, to reduce damage on sidewalls, and to suppress etching in the lateral direction by generating a plasma of a gas compound having a thioether skeleton represented by general formula (1) or a mixed gas thereof and etching a film consisting of a composite material or a single material, such as $SiO_2$ or SiN, thereby depositing a protective film that (Continued)

contains sulfur atoms and has a lower content of fluorine atoms than the cases of using common hydrofluorocarbon gases:

$$\text{general formula (1): } Rf_1-S-Rf_2 \quad (1)$$

where $Rf_1$ is a monovalent organic group represented by $C_xH_yF_z$ and $Rf_2$ is a monovalent organic group represented by $C_aH_bF_c$.

9 Claims, 6 Drawing Sheets

(56) References Cited

U.S. PATENT DOCUMENTS

2017/0068162 A1    3/2017  Kasahara
2017/0372916 A1*  12/2017  Kudo .............. H01J 37/32091

FOREIGN PATENT DOCUMENTS

| JP | 2015070270 A | 4/2015 |
|----|--------------|--------|
| JP | 2016529740 A | 9/2016 |
| JP | 2017054921 A | 3/2017 |
| JP | 2017084966 A | 5/2017 |

OTHER PUBLICATIONS

International Search Report of PCT/JP2019/024633 dated Aug. 27, 2019.

Hyun-Ho Doh, et al., Mechanism of selective SiO2/Si etching with fluorocarbon gases (CF4, C4F8) and hydrogen mixture in electron cyclotron resonance plasma etching system, Journal of Vacuum Science & Technology, Jun. 4, 1998, pp. 2827-2834, 14 (5).

* cited by examiner

PLASMA ETCHING METHOD USING GAS MOLECULE CONTAINING SULFUR ATOM

TECHNICAL FIELD

The present invention relates to a dry etching method using a thioether compound that contains fluorine, hydrogen, carbon, and sulfur atoms.

BACKGROUND ART

Miniaturization and the use of novel materials, for example, are vigorously investigated today for further fast operation and power saving of semiconductor devices Microfabrication of semiconductor devices to this end is performed by dry etching using a plasma of a fluorocarbon (hereinafter, also referred to as "FC") gas or a hydrofluorocarbon (hereinafter, also referred to as "HFC") gas.

There is a case in which $SiO_2$ or SiN patterned with a mask material on a substrate is etched with a plasma of an FC gas or HFC gas. In such a case, for example, etching of a $SiO_2$ pattern proceeds since carbon atoms contained in an FC or HFC react with oxygen of $SiO_2$ to form volatile products, such as CO and $CO_2$. Meanwhile, etching of the mask material and O-free films is less likely to proceed due to carbon components remaining thereon. Consequently, $SiO_2$ is etched selectively over the mask material.

Here, $CF_x$ radicals generated when forming a plasma of an FC gas or HFC gas are adsorbed onto the surface of $SiO_2$, but this alone does not allow reactions to proceed. However, when a plasma etching apparatus having a mechanism for drawing chemically inert ions, such as $Ar^+$, and/or chemically reactive ions, such as $CF_3^+$, to the substrate is used, ion bombardment of the $SiO_2$ surface, on which $CF_x$ radicals have been deposited, promotes reactions between the $SiO_2$ surface and $CF_x$ radicals due to the kinetic energy of ions to form volatile products. Etching like this is generally called as ion-assisted etching.

In ion-assisted etching, etching reactions proceed through ion bombardment of the surface onto which $CF_x$ radicals have been adsorbed. For this reason, when a substrate having a $SiO_2$ pattern is irradiated with ions from the vertical direction, etching proceeds in the vertical direction along which the ions impact. Meanwhile, $CF_x$ radicals without being used for etching remain in the horizontal direction of the pattern (pattern sidewalls), which is less susceptible to ion bombardment, to form a fluorocarbon polymer through reactions between the radicals. Such a fluorocarbon polymer has effects of suppressing reactions between $SiO_2$ sidewalls and highly reactive radicals, such as fluorine radicals; preventing etching of $SiO_2$ sidewalls due to ions that impact on the sidewalls from directions other than the vertical direction; and enhancing the selectivity of an etching target over a mask material through deposition on the mask material as well. By ion-assisted etching like this or by etching while protecting sidewalls and a mask, it is possible to realize anisotropic etching in which etching proceeds selectively in the vertical direction of the pattern. Further, by applying this technique, high aspect ratio etching of fine patterns is possible.

In high aspect ratio pattern etching of a $SiO_2$ by ion-assisted etching, FC gases, such as $C_4F_8$ and $C_4F_6$, that tend to generate, in a plasma, CF, $CF_2$, or other radicals containing a fewer fluorine atoms are used. Meanwhile, in pattern etching of SiN, HFC gases containing H, such as $CH_2F_2$ and $CH_3F$ are used.

Moreover, from a viewpoint of the shape of a high aspect ratio pattern, it is important to maintain the shape of a mask material that exists on an etching target material During plasma etching for forming openings on a mask material or during etching of a material, such as $SiO_2$ or SiN, using the resulting mask having openings, the mask material is exposed to highly reactive ions and/or highly active radicals, such as fluorine radicals and oxygen radicals, in a plasma and is thus damaged. Such damage deforms the mask shape, and this also affects the underlying etching target to distort the shape.

For the purpose of suppressing such mask deformation, a gas containing sulfur atoms, such as COS or $SO_2$, is used in plasma etching Non-Patent Literature (NPL) 1 describes addition of COS in plasma etching for forming holes on an amorphous carbon layer (hereinafter, referred to as ACL in some cases) mask, which is used as a mask material for $SiO_2$ etching. As this result, it is disclosed, in $SiO_2$ etching performed after the hole etching, that etching of the mask was suppressed and the selectivity of $SiO_2$ over the ACL mask was improved by about 20%. According to NPL 1, the effects of COS addition are attributed to the passivation effects of C=S since sulfur atoms were detected in the ACL mask treated with a plasma added with COS.

Patent Literature (PTL) 1 discloses that $H_2S$ or $CS_2$ is added when forming an ashable hard mask (AHM: hard mask that comprises carbon, hydrogen, and optionally, a trace amount of one or more dopants and that is removable by ashing), a sulfur-doped AHM with low hydrogen content is formed as a result; and the AHM retards the etching rate and is easily removable, resulting in a highly selective hard mask for effective semiconductor processing.

For the purpose of enhancing the selectivity over mask materials and improving the processed shapes, etching gases containing sulfur are used in the present invention as well. However, etching gases in the present invention use thioether compounds having F atoms, which are absent in COS or $SO_2$ described in NPL 1. Consequently, it is possible to suppress etching of a mask material, such as ACL, and to protect pattern sidewalls while etching an etching target, such as $SiO_2$.

PTL 2 describes etching using $CSF_2$ and $S_2F_2$ as etching gases containing sulfur atoms. In a two-layer structure of $SiO_2$ disposed on SiN, it is desirable in some cases to etch only $SiO_2$ and stop etching at SiN. According to PTL 2, by using the etching gases containing sulfur atoms in such a case, sulfur reacts with nitrogen of SiN to form sulfur nitrides, which are less susceptible to etching. Consequently, the etching selectivity of $SiO_2$ over SiN is enhanced. Meanwhile, the present invention is also characterized by the use of etching gases containing sulfur. However, etching gases used in the present invention contain hydrogen atoms, which are absent in $CSF_2$ and $S_2F_2$ described in PTL 2 Consequently, it is possible to etch Si-based films containing nitrogen atoms (SiN and SiON, for example).

For the purpose of improving etched shapes and enhancing the selectivity between Si-containing layers and mask materials in etching of pattern high aspect ratio structures, PTL 3 discloses that the selectivity over amorphous silicon (hereinafter, referred to as a-Si in some cases) and amorphous carbon in etching of $SiO_2$ or SiN can be enhanced by using $C_2F_4S_2$ (2,2,4,4-tetrafluoro-1,3-dithiethane), $C_2H_3CF_3S$ (2,2,2-trifluoroethanethiol), and so forth as etching gases. Meanwhile, the present invention uses highly volatile low-boiling thioether compounds, rather than high-boiling etching gases, such as 2,2,4,4-tetrafluoro-1,3-dithiethane and 2,2,2-trifluoroethanethiol in the background invention. This makes gas supply to etching apparatuses easy. Moreover, by adjusting etching conditions, not only selective etching of $SiO_2$ or SiN over mask materials, such as a-Si and ACL, but also selective etching of SiN over $SiO_2$ is possible.

CITATION LIST

Patent Literature

PTL 1. Japanese Unexamined Patent Application Publication No. 2015-70270
PTL 2. Japanese Unexamined Patent Application Publication No 7-211694
PTL 3. Japanese Unexamined Patent Application Publication (Translation of PCT Application) No. 2016-529740

Non Patent Literature

NPL 1. Journal of Vacuum Science & Technology A: Vacuum, Surfaces, and Films 31, 021301 (2013)

SUMMARY OF INVENTION

Technical Problem

Aiming at further high capacity, low power consumption, and fast operation, there is a continuing need for miniaturization of semiconductor devices, such as DRAM, NAND flash memories, and logic devices. However, miniaturization has already reached the single digit nanometer level in recent years, thereby making it difficult to attain further high capacity, low power consumption, and fast operation by the existing device architecture. For this reason, leading-edge NAND flash memories are manufactured as the three-dimensional device architecture called 3-D NAND, which is the vertically stacked device architecture. Moreover, in logic devices as well, to reduce increases in gate leakage current due to miniaturization, the architecture called Fin-FET in which a three-dimensional channel structure is surrounded by a gate insulating film has become mainstream as the leading-edge architecture (FIG. 1).

Three-dimensional device architecture in advanced devices as described above complicates etching characteristics required for dry etching. For example, dry etching for forming channel holes in 3D-NAND requires high aspect ratio etching of a multilayer film consisting of a plurality of $SiO_2$ and SiN layers using a material, such as ACL, as a mask (FIG. 2). On such an occasion, it is required to selectively etch, over the mask, a film comprising different materials, such as $SiO_2$ and SiN, together. Moreover, further high aspect ratio etching is desired as the device capacity increases.

Meanwhile, in logic devices, particularly in advanced logic devices, the device architecture is built by stacking various Si-containing materials, such as Si, $SiO_2$, SiN, and low-k materials (SiOC). For this reason, high selectivity not only over mask materials but also over other Si-containing films having the similar composition is required for plasma etching employed in processing of such devices.

In the above-described high aspect ratio etching of a multilayer structure consisting of plurality of $SiO_2$ and SiN in 3D-NAND or etching for producing a Fin-FET structure in advanced logic devices, not only the foregoing selectivity over mask materials and so forth but also controlling of the processed shapes is a critical issue. Here, in ion-assisted etching, etching readily proceeds in regions where $CF_x$ radicals are adsorbed onto and ions impact. For this reason, ion-assisted etching is adopted in a plasma etching apparatus used for actual device fabrication processes to perform processing in the vertical direction by electrically drawing ions in a plasma to a silicon substrate. However, in actual etching, ions not necessarily hit only from the vertical direction, and oblique incidence and curved trajectory of ions in high aspect ratio patterns are also possible in some cases. As a result, desirable shapes are not obtained due to swelling, thinning, or bending of the shapes, thereby lowering the yield.

Solution to Problem

The present inventors conducted intensive studies to resolve the above-mentioned problems and, as a result, found possible, by generating a plasma of a gas compound having a specific thioether skeleton or a mixed gas thereof and using the plasma for dry etching, to enhance the selectivity over materials other than an etching target, to enhance the selectivity over specific Si-containing materials, and to improve etching processed shapes, thereby completing the present invention.

According to the present invention, the following embodiments are provided.

[1] A method of etching a Si-containing film by a gas plasma containing a compound represented by general formula (1) below:

where $Rf_1$ is a monovalent organic group represented by $C_xH_yF_z$; x, y, and z are each a positive number satisfying x=1 to 3, y=1 to 7, z=0 to 6, and y+z≤2x+1; $Rf_2$ is a monovalent organic group represented by $C_aH_bF_c$; and a, b, and c are each a positive number satisfying a=1 to 3, b=0 to 6, c=1 to 7, and b+c≤2a+1.

[2] The method according to [1], where the Si-containing film is a single-layer film comprising one material containing Si or a multilayer film of stacked two or more materials containing Si.

[3] The method according to [1] or [2], where the gas plasma contains, in addition to the compound represented by general formula (1), at least one selected from the group consisting of HF, HCl, HBr, HI, $CF_4$, $CHF_3$, $CH_2F_2$, $CH_3F$, $COF_2$, $C_2F_6$, $C_3F_6$, $C_3F_8$, $C_4F_8$, $C_4F_6$, $C_5F_8$, $NF_3$, and $SF_6$.

[4] The method according to any one of [1] to [3], where:
the Si-containing film constitutes, together with a material that is not to be etched, a structure; and
a film that contains S but has F content of 1% or less is deposited on a surface of the structure during etching.

[5] The method according to any one of [1] to [4], where the Si-containing film is a film comprising at least one material selected from the group consisting of $SiO_2$, SiN, SiON, SiCN, SiOC, and SiOCN.

[6] The method according to any one of [1] to [5], where the material that is not to be etched is at least one selected from the group consisting of an amorphous carbon layer (ACL), spin-on carbon (SOC), TiN, TaN, and photoresists.

[7] The method according to any one of [1] to [6], where the compound represented by general formula (1) is at least one selected from the group consisting of $CHF_2$—S—$CF_3$, $CH_2F$—S—$CF_3$, $CH_3$—S—$CF_3$, $CH_3$—S—$CHF_2$, $CH_3$—S—$CH_2F$, $CH_2F$—S—$CH_2F$, $CH_2F$—S—$CHF_2$, and $CHF_2$—S—$CHF_2$.

[8] The method according to any one of [1] to [7], where the gas plasma further contains at least one selected from the group consisting of $N_2$, $O_2$, $O_3$, CO, $CO_2$, COS, $N_2O$, NO, $NO_2$, $SO_2$, and $SO_3$.

[9] The method according to any one of [1] to [8], where the gas plasma further contains at least one selected from the group consisting of $H_2$, $NH_3$, and $SiH_4$.

[10] The method according to any one of [1] to [9], where the gas plasma further contains at least one selected from the group consisting of He, Ar, Ne, Kr, and Xe.

According to the present invention, a method of using a compound represented by general formula (1) below for plasma etching is also provided:

$$Rf_1\text{—}S\text{—}Rf_2 \qquad (1)$$

where $Rf_1$ is a monovalent organic group represented by $C_xH_yF_z$; x, y, and z are each a positive number satisfying x=1 to 3, y=1 to 7, z=0 to 6, and y+z≤2x+1; $Rf_2$ is a monovalent organic group represented by $C_aH_bF_c$; and a, b, and c are each a positive number satisfying a=1 to 3, b=0 to 6, c=1 to 7, and b+c≤2a+1.

Advantageous Effects of Invention

By generating a plasma of a gas compound having a specific thioether skeleton represented by general formula (1) or a mixed gas thereof and using the plasma for dry etching, the present invention resolves existing problems, issues, or the like and has the following advantages.

(1) The gas compound having a specific thioether skeleton of the present invention enables, due to hydrogen atoms and fluorine atoms within the molecule, plasma etching of $SiO_2$ and SiN in a similar manner to common HFC gases and further enables highly selective etching of etching target materials over materials other than the etching targets compared with common HFC gases since sulfur atoms effectively form less volatile products and inhibit etching of the materials other than the etching targets.

(2) The gas compound having a specific thioether skeleton of the present invention forms a polymer film during plasma etching in a similar manner to common HFC gases. The polymer film, although deposited at a deposition rate almost comparable to a polymer film formed from an HFC gas plasma having the composition close to the gas compound of the present invention, is characterized by being readily etched with ions. Moreover, in comparison of polymer film components, the polymer film has a lower content of fluorine atoms than a polymer film formed from an HFC gas. From these characteristics, by using the gas compound having a specific thioether skeleton of the present invention in pattern etching, it is possible to allow etching in the vertical direction to proceed through ion bombardment without any trouble in a similar manner to common HFC gases but to suppress etching reactions in the sidewall direction through deposition of a polymer film having a low content of highly reactive fluorine atoms. Consequently, plasma etching into satisfactorily vertical processed shapes is possible.

(3) Through addition to a gas plasma containing a commonly used etching gas (HF, HCl, HBr, HI, $CF_4$, $CHF_3$, $CH_2F_2$, $CH_3F$, $COF_2$, $C_2F_6$, $C_3F_6$, $C_3F_8$, $C_4F_8$, $C_4F_6$, $C_5F_8$, $NF_3$, or $SF_6$, for example), the gas compound having a specific thioether skeleton of the present invention can enhance the selectivity of an etching target material over materials other than the etching target compared with gas plasmas without such addition.

(4) Through addition to a gas plasma containing a commonly used etching gas (HF, HCl, HBr, HI, $CF_4$, $CHF_3$, $CH_2F_2$, $CH_3F$, $COF_2$, $C_2F_6$, $C_3F_6$, $C_3F_8$, $C_4F_8$, $C_4F_6$, $C_5F_8$, $NF_3$, or $SF_6$, for example), the gas compound having a specific thioether skeleton of the present invention enables plasma etching into satisfactorily vertical processed shapes compared with gas plasmas without such addition.

DESCRIPTION OF EMBODIMENTS

Figure 1:
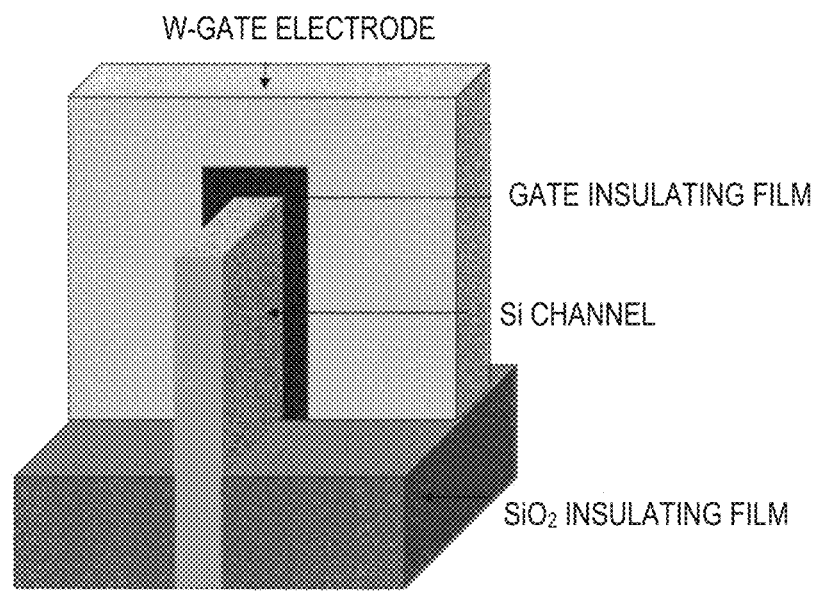
FIG. 1 illustrates a typical Fin-FET structure.

Hereinafter, a plasma etching method in the present invention will be described in detail. However, the scope of the present invention is not limited to the scope described hereinafter and modifications are possible without departing from the spirit of the present invention.

The plasma etching method in the present invention uses a gas compound having a thioether skeleton represented by general formula (1) below or a mixed gas thereof:

$$Rf_1\text{—}S\text{—}Rf_2 \qquad (1)$$

where $Rf_1$ is a monovalent organic group represented by $C_xH_yF_z$; x, y, and z are each a positive number satisfying x=1 to 3, y=1 to 7, z=0 to 6, and y+z≤2x+1; $Rf_2$ is a monovalent organic group represented by $C_aH_bF_c$; and a, b, and c are each a positive number satisfying a=1 to 3, b=0 to 6, c=1 to 7, and b+c≤2a+1.

In the plasma etching method in the present invention, it is preferable to use, in view of easy supply to a plasma etching apparatus, a gas compound satisfying x=1 to 2, y=1 to 3, z=0 to 3, a=1 to 2, b=0 to 3, and c=0 to 3 as the gas compound having a thioether skeleton represented by general formula (1). Moreover, it is more preferable to use a gas compound having any structure of $CHF_2$—S—$CF_3$, $CH_2F$—S—$CF_3$, $CH_3$—S—$CF_3$, $CH_3$—S—$CHF_2$, $CH_3$—S—$CH_2F$, $CH_2F$—S—$CH_2F$, $CH_2F$—S—$CHF_2$, and $CHF_2$—S—$CHF_2$.

In the plasma etching method in the present invention, a gas compound having a thioether skeleton represented by general formula (1) may have a purity of 95.0 vol % to 100.0 vol % The gas compound having a purity of 99 vol % or more is preferably used, and the gas compound having a purity of 99.9 vol % or more is more preferably used Exemplary impurity components include $N_2$, $O_2$, $CO_2$, $H_2O$, HF, HCl, $SO_2$, and $CH_4$. Among these impurity components, $H_2O$, HF, HCl, and $SO_2$, for example, are preferably removed as much as possible through purification since these impurity components are more likely to corrode channels for gas circulation.

In the plasma etching method in the present invention, by using a gas compound represented by general formula (1) mixed with other FC gases or HFC gases, it is possible to enhance the selectivity of an etching target material over materials other than the etching target compared with the cases that lack mixing with a gas compound represented by general formula (1). Moreover, accuracy in vertical processing is also enhanced when etching a structure patterned with a material other than an etching target.

When an etching target material is an oxygen-containing Si-based material, such as $SiO_2$, in a structure patterned with a material other than the etching target as mentioned above, it is preferable to use, for plasma etching, a gas compound represented by general formula (1) mixed with an etching gas, such as $CF_4$, $CHF_3$, $C_2F_6$, $C_3F_8$, $C_4F_8$, $C_4F_6$, or $C_5F_8$, in view of selective etching as well as etching with satisfactory accuracy in vertical processing. In particular, when high selectivity is required, it is preferable to mix with $C_4F_8$, $C_4F_6$, or $C_5F_8$ that has a higher C number.

When an etching target material is a nitrogen-containing Si-based material, such as SiN, in a structure patterned with a material other than the etching target, it is preferable to use, for plasma etching, a gas compound represented by general formula (1) mixed with an HFC gas, such as $CHF_3$, $CH_2F_2$, or $CH_3F$, in view of selective etching as well as etching with satisfactory accuracy in vertical processing. In particular, when high selectivity is required, it is also effective to use an HFC gas having a C number of 2 or more.

In the plasma etching method in the present invention, by adding any one or a plurality of $N_2$, $O_2$, $O_3$, CO, $CO_2$, COS, $N_2O$, NO, $NO_2$, $SO_2$, and $SO_3$ to a gas plasma containing a gas compound represented by general formula (1), it is possible to obtain the effects of suppressing excessive deposition (deposits), increasing the etching rate of an etching target, and enhancing the selectivity of an etching target over materials other than the etching target.

As for the purposes of suppressing excessive deposition and increasing the etching rate of an etching target, it is preferable, in particular, to add any one or a plurality of $O_2$, $O_3$, $CO_2$, NO, $N_2O$, $NO_2$, $SO_2$, and $SO_3$. Among these, $O_2$, $O_3$, $NO_2$, $SO_2$, or $SO_3$ is particularly preferably used.

As for the purposes of increasing the etching rate of an etching target and enhancing the selectivity of an etching target over materials other than the etching target, it is preferable to use $N_2$, CO, COS, or $N_2O$. Among these, $N_2$ or COS is particularly preferably used.

In the plasma etching method in the present invention, by adding any one or a plurality of $H_2$, $NH_3$, and $SiH_4$ to a gas plasma containing a gas compound represented by general formula (1), it is possible to obtain the effects of suppressing excessive generation of F radicals to enhance the selectivity of an etching target material over materials other than the etching target and increasing the etching rate of a Si- and N-containing film. For these purposes, $H_2$ is particularly preferable.

In the plasma etching method in the present invention, any rare gas of He, Ar, Ne, Kr, or Xe may be used as a diluent gas for a gas plasma containing a gas compound represented by general formula (1). Among these, He, Ar, or Xe is preferably used.

Exemplary etching gases used in the method of the present invention include the following.

(a) Gas compound represented by general formula (1) alone

The main advantage is that highly selective etching of Si-based films over mask materials is possible since a deposition film containing sulfur atoms is formed.

(b) Gas compound represented by general formula (1) (5 to 80 volume %) and rare gas (20 to 95 volume %)

The main advantage is that excessive deposition and the resulting etch stopping are suppressed compared with the sole use of the gas compound.

(c) Gas compound represented by general formula (1) (5 to 60 volume %), any one or a plurality of $N_2$, $O_2$, $O_3$, CO, $CO_2$, COS, $N_2O$, NO, $NO_2$, $SO_2$, and $SO_3$ (1 to 50 volume %), and rare gas (0 to 94 volume %)

The main advantage is that it is possible to suppress excessive deposition and to adjust the selectivity among mask materials, Si-based films other than etching targets, and Si-based films as etching targets, compared with the sole use of the gas compound.

(d) Gas compound represented by general formula (1) (1 to 50 volume %), any one or a plurality of $CF_4$, $CHF_3$, $C_2F_6$, $C_3F_8$, $C_4F_8$, $C_4F_6$, and $C_5F_8$ (1 to 50 volume %), any one or a plurality of $N_2$, $O_2$, $O_3$, CO, $CO_2$, COS, $N_2O$, NO, $NO_2$, $SO_2$, and $SO_3$ (1 to 50 volume %), and rare gas (0 to 97 volume %)

The main advantage is that it is possible to increase the etching rate of O-containing Si-based films and to enhance the selectivity over mask materials, compared with the sole use of the gas compound.

(e) Gas compound represented by general formula (1) (1 to 50 volume %), any one or a plurality of $CHF_3$, $CH_2F_2$ and $CH_3F$ (1 to 50 volume %), any one or a plurality of $N_2$, $O_2$, $O_3$, CO, $CO_2$, COS, $N_2O$, NO, $NO_2$, $SO_2$, and $SO_3$ (0 to 50 volume %), any one or a plurality of $H_2$, $NH_3$, and $SiH_4$ (0 to 50 volume %), and rare gas (0 to 98 volume %)

The main advantage is that it is possible to suppress excessive generation of F radicals, to increase the etching rate of N-containing Si-based films, and to enhance the selectivity over mask materials, compared with the sole use of the gas compound.

For the plasma etching in the present invention, various plasma etching apparatuses can be used regardless of plasma sources provided that a stable plasma can be generated by a plasma generation mode, such as CCP (capacitively coupled plasma), ICP (inductively coupled plasma), or ECR (electron cyclotron resonance). Moreover, the plasma etching method in the present invention can enhance the effects of the present invention by irradiating a substrate with ions generated in a plasma. Accordingly, a plasma etching apparatus preferably includes a mechanism for drawing ions to a substrate by an electric action. Further, some plasma etching apparatuses can separately set the energy for generating a plasma (source power) and the energy for irradiating a substrate with ions in a plasma (bias power). Such apparatuses are preferably used when the processed shapes are controlled further accurately.

The plasma etching method in the present invention performs vertical processing of a fine pattern wafer of a Si-based material. For this reason, a plasma etching apparatus used for the plasma etching needs to be an apparatus equipped with a vacuum chamber that can reproduce low gas pressure conditions suitable for ion-assisted etching. Under low pressure conditions, particles in a plasma tend to move in a straight line, and ions for irradiating a substrate also reach the substrate without being blocked by other particles. Accordingly, such low pressure conditions are advantageous for vertical processing since ions incident normal to a substrate increase. In the plasma etching method of the present invention, the pressure inside the vacuum chamber during etching is preferably adjusted to 100 Torr to 0.1 mTorr and further preferably adjusted to 100 mTorr to 0.1 mTorr.

In the plasma etching method in the present invention, a gas compound represented by general formula (1) is preferably introduced as a gas as it is into a vacuum chamber of a plasma etching apparatus. Accordingly, a plasma etching apparatus used for the plasma etching method in the present invention preferably includes a mechanism for introducing a gas compound represented by general formula (1) as a gas as it is and further for adjusting the amount introduced. Moreover, regarding such a mechanism, since a plurality of gas compounds other than the gas compound represented by general formula (1), such as $O_2$, Ar, and $CF_4$, are effectively used depending on the purposes, four or more mechanisms for introducing gases and adjusting the amounts introduced are preferably included in the plasma etching method in the present invention.

In the plasma etching method in the present invention, a gas compound represented by general formula (1) and other gas compounds used for the plasma etching are each preferably adjusted to a flow rate within the range of 1 to 3,000 sccm and introduced into a vacuum chamber of a plasma etching apparatus. Moreover, the flow rate is particularly preferably adjusted within the range of 1 to 1,000 sccm.

EXAMPLES

Hereinafter, the present invention will be described in further detail by means of the Examples and Comparative Examples. However, the present invention is by no means limited to these examples.

Figure 3:
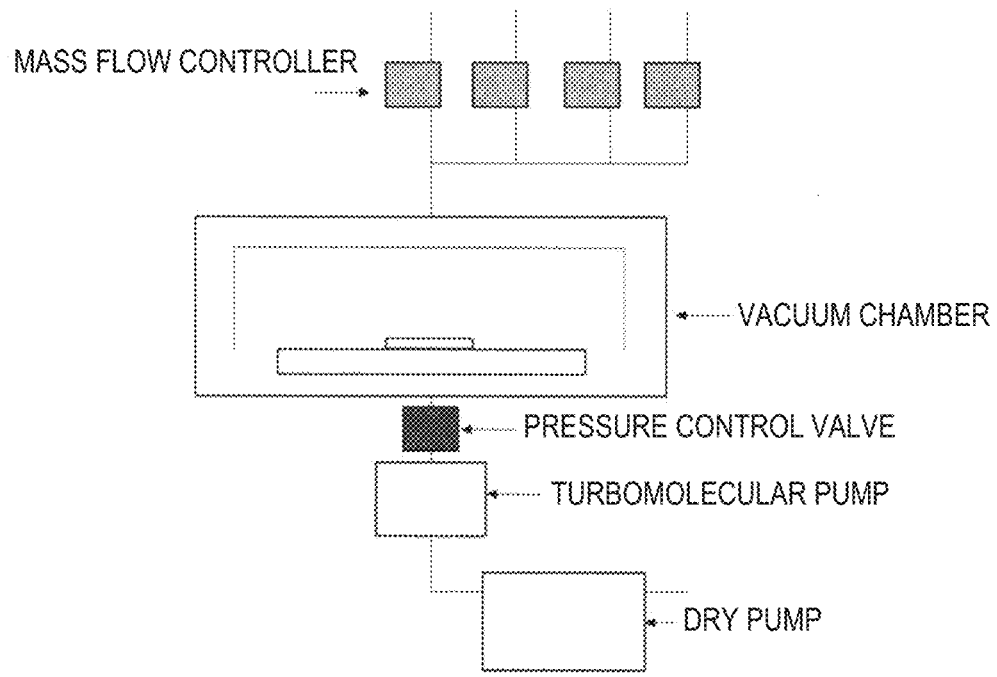
FIG. 3 schematically illustrates a plasma etching apparatus used for working examples of the present invention.

The following examples were performed using a CCP-mode plasma etching apparatus illustrated in FIG. 3. The apparatus is provided with a vacuum chamber for generating a plasma at a low pressure; a temperature control mechanism for controlling the temperature of a sample to be treated; and four systems of gas pipes each equipped with a mass flow controller as a mechanism for introducing a gas compound represented by general formula (1) or other gas compounds used in plasma etching and for adjusting the amount introduced. Further, the apparatus is also provided with two vacuum pumps of a turbomolecular pump and a dry pump for reducing the pressure inside the vacuum chamber to a predetermined low pressure; and a pressure control valve, between the vacuum chamber and the vacuum pumps, for adjusting the pressure inside the vacuum chamber. Although the apparatus of FIG. 3 is a CCP-mode plasma etching apparatus, which generates a plasma by applying RF power between a pair of top and bottom electrodes inside the vacuum chamber, other apparatuses, such as an ICP-mode plasma etching apparatus and an ECR-mode plasma etching apparatus, are also usable.

Etching target samples used in the present working examples are as follows.

Measurement of etching rate using blanket wafers (not patterned)

SiN: SiN deposited at a thickness of 300 nm on a Si substrate by thermal CVD $SiO_2$. $SiO_2$ deposited at a thickness of 1,000 nm on a Si substrate by plasma CVD The thicknesses of the blanket wafers before and after plasma etching are measured using an interference-mode film thickness meter, and the etching rate is calculated from the difference (formula 1). The selectivity in Table 1 is calculated from the amount of SiN or $SiO_2$ etched and the amount of each mask material etched (formula 2).

Etching rate (nm/min)=[[sample film thickness before etching (nm)]−[sample film thickness after etching (nm)]]/[etching time (min)] (Formula 1)

Selectivity=(amount of $SiO_2$ or SiN etched)/(amount of another film etched) (Formula 2)

Evaluation of Plasma Etched Shapes Using Pattern Wafers

Figure 4:
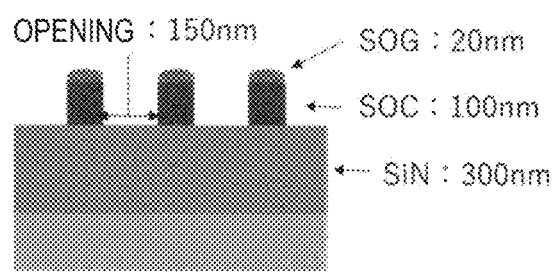
FIG. 4 schematically illustrates a SOC/SiN pattern wafer used in the working examples of the present invention.

SOC/SiN pattern wafer, as illustrated in FIG. 4, SiN is deposited at a thickness of 300 nm on a Si substrate, and SOC (carbon-based material corresponding to ACL) of 100 nm in thickness and SOG (material corresponding to $SiO_2$) of 20 nm in thickness are stacked in this order on SiN. The opening width of the mask is 150 nm.

Figure 5:
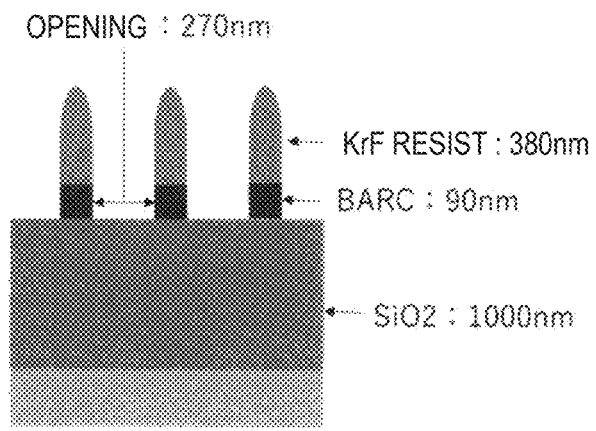
FIG. 5 schematically illustrates a KrF resist/$SiO_2$ pattern wafer used in the working examples of the present invention.

KrF resist/$SiO_2$ pattern wafer: as illustrated in FIG. 5, $SiO_2$ is deposited at a thickness of 1,000 nm on a Si substrate, and an antireflective film (BARC: material corresponding to SiON) of 90 nm in thickness and a KrF resist (resin material comprising C, H, and so forth) of 380 nm in thickness are stacked in this order on $SiO_2$. The opening width of the mask is 270 nm.

As for the pattern wafers, the cross-sections of a sample untreated with plasma etching and a sample after plasma etching treatment were observed using a scanning electron microscope (FE-SEM). The amount of changes from an untreated sample through plasma etching was assessed by measuring the lengths on the obtained observation images.

Herein, the unit of gas compositional ratios is volume % unless otherwise indicated.

Further, the amount of changes in film thickness is expressed as a positive value for a reduction in film thickness due to etching and as a negative value for an increase in film thickness due to deposition.

Example 1

Figure 6:
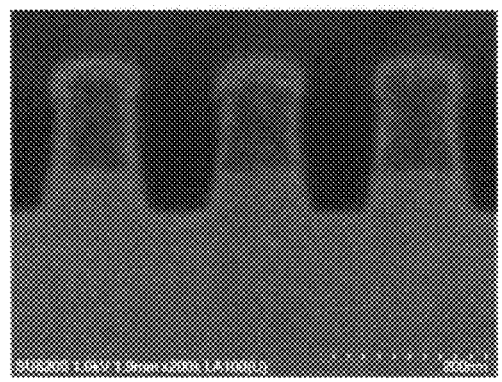
FIG. 6 is an SEM image of the cross-section of a SOC/SiN pattern wafer after plasma treatment in Example 1.

A plasma was generated under conditions of $CH_3SCF_3$: 21.4%, $O_2$: 7.1%, Ar: 71.4%, pressure: 10 Pa, and RF power: 300 W; a SOC/SiN pattern wafer sample was treated with the plasma for a time required for etching the SiN layer by about 50 nm; and the cross-section of the sample was observed with an FE-SEM (FIG. 6). As the etching time, the time for etching SiN by 50 nm is obtained from the etching rate of a SiN blanket wafer calculated in accordance with formula 1 after etching the SiN blanket wafer under the same conditions as the conditions for etching the pattern wafer. The changes in film thickness after etching for the SOG layer, SOC layer, and SiN layer of the pattern wafer were SOG: 11.3 nm, SOC: ±0 nm, and SiN: 56.0 nm. Consequently, selective etching of the SOG and SiN films over the SOC film was possible.

Example 2

Figure 7:
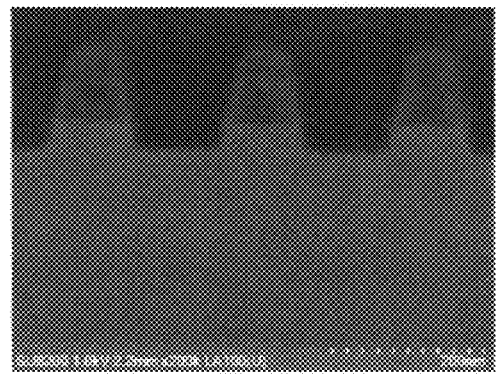
FIG. 7 is an SEM image of the cross-section of a SOC/SiN pattern wafer after plasma treatment in Example 2.

A plasma was generated under conditions of $CH_3SCF_3$: 23.5%, $O_2$: 17.6%, Ar: 58.8%, pressure: 10 Pa, and RF power: 300 W; a SOC/SiN pattern wafer sample was treated with the plasma for a time required for etching the SiN layer by about 50 nm, and the cross-section of the sample was observed with an FE-SEM (FIG. 7). The changes in film thickness after etching for the SOG layer, SOC layer, and SiN layer of the pattern wafer were SOG: 20.0 nm, SOC: ±0 nm, and SiN: 42.0 nm. Consequently, selective etching of the SOG and SiN films over the SOC film was possible.

Comparative Example 1

A plasma was generated under conditions of $CH_2F_2$: 28.6%, $O_2$: 0%, Ar: 71.4%, pressure: 10 Pa, and RF power: 300 W; a SOC/SiN pattern wafer sample was treated with the plasma for a time required for etching the SiN layer by about 50 nm, and the cross-section of the sample was observed with an FE-SEM. The result revealed that the pattern was covered with a deposition film and etching did not proceed at all.

Comparative Example 2

Figure 8:
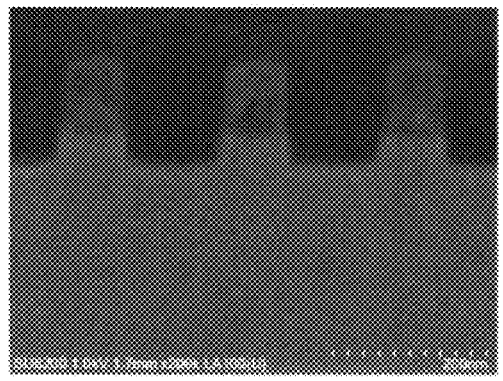
FIG. 8 is an SEM image of the cross-section of a SOC/SiN pattern wafer after plasma treatment in Comparative Example 2.

A plasma was generated under conditions of $CH_2F_2$: 26.7%, $O_2$: 6.7%, Ar: 66.7%, pressure: 10 Pa, and RF power: 300 W; a SOC/SiN pattern wafer sample was treated with the plasma for a time required for etching the SiN layer by about 50 nm, and the cross-section of the sample was observed with an FE-SEM (FIG. 8). The changes in film thickness after etching for the SOG layer, SOC layer, and SiN layer of the pattern wafer were SOG. 20.0 nm, SOC: 2.0 nm, and SiN: 43.0 nm. Consequently, selective etching of SiN or selective etching of SOG and SiN over SOC as in Examples 1 and 2 was impossible.

Comparative Example 3

A plasma was generated under conditions of 1,1,1-trifluoroethane ($CF_3CH_3$): 26.7%, $O_2$: 6.7%, Ar: 66.7%, pressure: 10 Pa, and RF power: 300 W; a SOC/SiN pattern wafer sample was etched with the plasma for a time required for etching the SiN layer by about 50 nm, and the cross-section of the sample was observed with an FE-SEM. The result revealed that the pattern was covered with a deposition film and etching did not proceed at all.

Comparative Example 4

Figure 9:
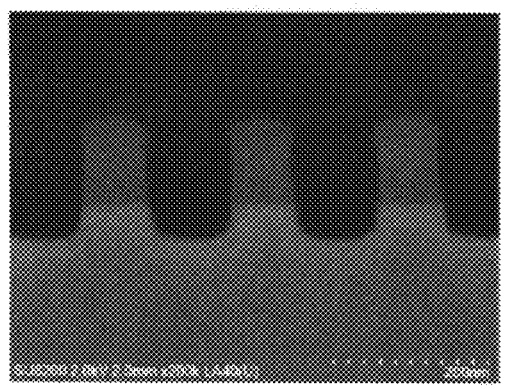
FIG. 9 is an SEM image of the cross-section of a SOC/SiN pattern wafer after plasma treatment in Comparative Example 4.

A plasma was generated under conditions of 1,1,1-trifluoroethane ($CF_3CH_3$): 25.0%, $O_2$: 12.5%, Ar: 62.5%, pressure: 10 Pa, and RF power: 300 W; a SOC/SiN pattern wafer sample was treated with the plasma for a time required for etching the SiN layer by about 50 nm, and the cross-section of the sample was observed with an FE-SEM (FIG. 9). The changes in film thickness after etching for the SOG layer, SOC layer, and SiN layer of the pattern wafer were SOG: 20.0 nm, SOC. 8.9 nm, and SiN. 43.0 nm. Consequently, selective etching of SiN alone as in Example 1 was impossible.

The foregoing results are summarized in Table 1.

TABLE 1

| | Gas | SOG [nm] | SOC [nm] | SiN [nm] | SOG/SOC selectivity | SiN/SOC selectivity | SiN/SOG selectivity |
|---|---|---|---|---|---|---|---|
| Ex. 1 | $CH_3SCF_3$ | 11.3 | 0 | 56 | ∞ | ∞ | 4.9 |
| Ex. 2 | $CH_3SCF_3$ | 2.0 | 0 | 42 | ∞ | ∞ | 2.1 |
| Comp. Ex. 1 | $CH_2F_2$ | 0 | 0 | 0 | 0 | 0 | 0 |
| Comp. Ex. 2 | $CH_2F_2$ | 20 | 2 | 43 | 10 | 21.5 | 2.2 |
| Comp. Ex. 3 | $CF_3CH_3$ | 0 | 0 | 0 | 0 | 0 | 0 |
| Comp. Ex. 4 | $CF_3CH_3$ | 20 | 8.9 | 43 | 2.2 | 4.8 | 2.2 |

Examples 1 and 2 and Comparative Examples 1 to 4 reveal that by using a gas compound having a thioether skeleton represented by general formula (1), it is possible, in a SiN pattern on which SOG and SOC are stacked, to etch SiN selectively over SOG and SOC and also to etch, by adjusting conditions, SOG and SiN selectively over SOC.

Example 3

Figure 10:
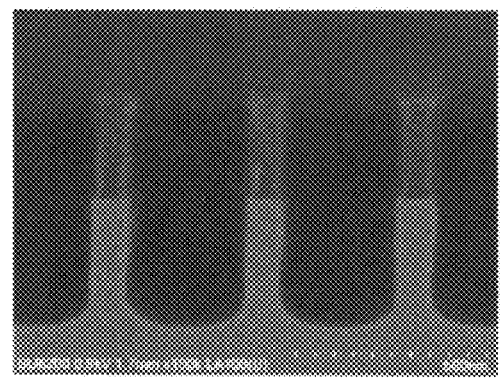
FIG. 10 is an SEM image of the cross-section of a KrF resist/$SiO_2$ pattern wafer as the evaluation reference for Example 3 and Comparative Examples 5 to 8.

A plasma was generated under conditions of $CHF_3$: 28.6%, $O_2$: 0%, Ar: 71.4%, pressure: 10 Pa, and RF power: 300 W; a KrF resist/$SiO_2$ pattern wafer was treated with the plasma for a time required for etching the $SiO_2$ by about 300 nm; and the cross-section of the sample was observed with an FE-SEM (FIG. 10). As the etching time, the time for etching $SiO_2$ by 300 nm is obtained from the etching rate of a $SiO_2$ blanket wafer calculated in accordance with formula 1 after etching the $SiO_2$ blanket wafer under the same conditions as the conditions for etching the pattern wafer. The changes from the mask opening width before etching of 270 nm to the opening width of $SiO_2$ after etching (the opening and the bottom of etched $SiO_2$) were assessed (formula 3).

Amount of changes in opening width of $SiO_2$ pattern (hereinafter, ΔWt)=opening width of $SiO_2$ after etching (Wt)−processed width of resist before etching (hereinafter, Wr)

Amount of changes in bottom width of $SiO_2$ pattern (hereinafter, ΔWb)=bottom width of $SiO_2$ pattern after etching (Wb)−processed width of resist before etching (hereinafter, Wr)  (Formula 3)

The results were $SiO_2$ etching depth: 338.7 nm, ΔWt=+36.5 nm, and ΔWb=+41.3 nm.

With the above-mentioned results as the reference, whether ΔWt and ΔWb become smaller than the reference results when $CH_3SCF_3$ is added was evaluated.

Figure 11:
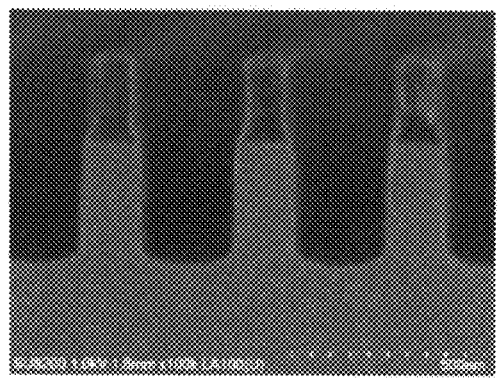
FIG. 11 is an SEM image of the cross-section of a KrF resist/$SiO_2$ pattern wafer after plasma treatment in Example 3.

A plasma was generated under conditions of $CHF_3$: 23.3%, $CH_3SCF_3$: 3.3%, $O_2$: 6.7%, Ar: 66.7%, pressure: 10 Pa, and RF power: 300 W; a KrF resist/$SiO_2$ pattern wafer was treated with the plasma for a time required for etching $SiO_2$ by about 300 nm, and the cross-section of the sample was observed with an FE-SEM (FIG. 11). The results were $SiO_2$ etching depth: 325.8 nm, $\Delta Wt=+0.6$ nm, and $\Delta Wb=+0.7$ nm Consequently, $\Delta Wt$ improved by 35.9 nm and $\Delta Wb$ improved by 40.6 nm.

Comparative Example 5

With the results obtained using $CHF_3$ as the reference in the same manner as Example 3, whether $\Delta Wt$ and $\Delta Wb$ become smaller than the reference results when $CH_2F_2$ is added was evaluated.

Figure 12:
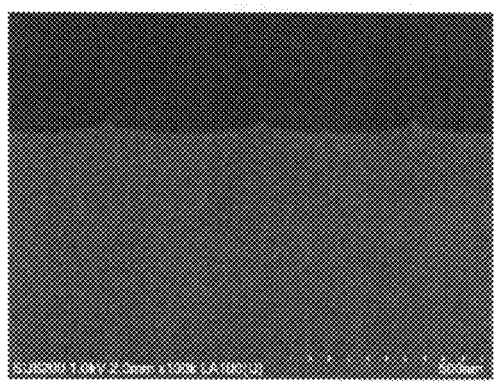
FIG. 12 is an SEM image of the cross-section of a KrF resist/$SiO_2$ pattern wafer after plasma treatment in Comparative Example 5.

A plasma was generated under conditions of $CHF_3$: 20.0%, $CH_2F_2$: 6.7%, $O_2$: 6.7%, Ar: 66.7%, pressure: 10 Pa, and RF power: 300 W; a KrF resist/$SiO_2$ pattern wafer was treated with the plasma for a time required for etching the $SiO_2$ by about 300 nm; and the cross-section of the sample was observed with an FE-SEM (FIG. 12). As a result, the KrF mask was lost and pattern etching was impossible.

Comparative Example 6

With the results obtained using $CHF_3$ as the reference in the same manner as Example 3, whether $\Delta Wt$ and $\Delta Wb$ become smaller than the reference results when $CH_2F_2$ is added was evaluated.

Figure 13:
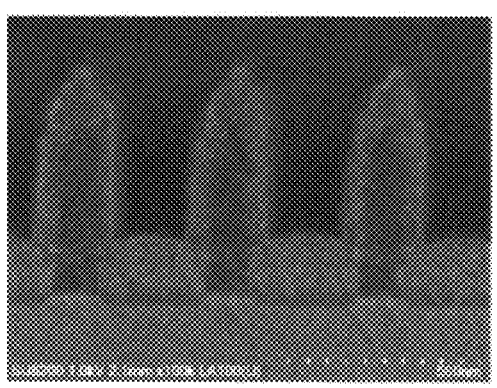
FIG. 13 is an SEM image of the cross-section of a KrF resist/$SiO_2$ pattern wafer after plasma treatment in Comparative Example 6.

A plasma was generated under conditions of $CHF_3$: 24.1%, $CH_2F_2$: 3.4%, $O_2$: 3.4%, Ar: 69.0%, pressure: 10 Pa, and RF power: 300 W; a KrF resist/$SiO_2$ pattern wafer was treated with the plasma for a time required for etching the $SiO_2$ by about 300 nm; and the cross-section of the sample was observed with an FE-SEM (FIG. 13). As a result, the pattern was covered with a deposition film and etching did not proceed at all.

Comparative Example 7

With the results obtained using $CHF_3$ as the reference in the same manner as Example 3, whether $\Delta Wt$ and $\Delta Wb$ become smaller than the reference results when $CF_3CH_3$ is added was evaluated.

Figure 14:
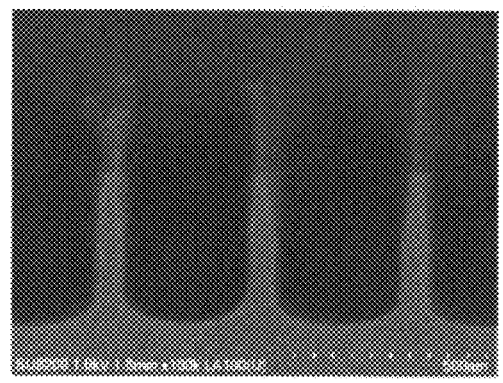
FIG. 14 is an SEM image of the cross-section of a KrF resist/$SiO_2$ pattern wafer after plasma treatment in Comparative Example 7.

A plasma was generated under conditions of $CHF_3$: 20.0%, $CF_3CH_3$: 6.7%, $O_2$: 6.7%, Ar: 66.7%, pressure: 10 Pa, and RF power: 300 W; a KrF resist/$SiO_2$ pattern wafer was treated with the plasma for a time required for etching the $SiO_2$ by about 300 nm; and the cross-section of the sample was observed with an FE-SEM (FIG. 14). The results were $SiO_2$ etching depth: 267.2 nm, $\Delta Wt=+35.2$ nm, and $\Delta Wb=+40.7$ nm. Consequently, $\Delta Wt$ improved by 1.3 nm and $\Delta Wb$ improved by 0.6 nm, but the improvements were smaller than the improvements in Example 3.

Comparative Example 8

With the results obtained using $CHF_3$ as the reference in the same manner as Example 3, whether $\Delta Wt$ and $\Delta Wb$ become smaller than the reference results when $CF_3CH_3$ is added was evaluated.

Figure 15:
FIG. 15 is an SEM image of the cross-section of a KrF resist/$SiO_2$ pattern wafer after plasma treatment in Comparative Example 8.

A plasma was generated under conditions of $CHF_3$ 24.1%, $CF_3CH_3$: 3.4%, $O_2$: 3.4%, Ar: 69.0%, pressure: 10 Pa, and RF power: 300 W; a KrF resist/$SiO_2$ pattern wafer was treated with the plasma for a time required for etching the $SiO_2$ by about 300 nm; and the cross-section of the sample was observed with an FE-SEM (FIG. 15). As a result, the pattern was covered with a deposition film and etching did not proceed at all.

The results of Example 3 and Comparative Examples 5 to 8 reveal that the processing accuracy of a $SiO_2$ pattern can be improved by using a gas compound having a thioether skeleton represented by general formula (1) as an additive gas.

Example 4

A plasma was generated under conditions of $CH_3SCF_3$: 28.6%, Ar: 71.4%, pressure: 5 Pa, and RF power: 100 W; and a Si substrate was treated with the plasma. For a deposit formed on the Si substrate, the deposition rate was calculated from the cross-sectional observation results and the compositional analysis by an SEM-EDX was performed. The results were deposition rate: 33.2 nm/min and mass concentrations [%] (C, F, S)=(86.5, 0.7, 12.8).

A plasma was generated under conditions of $CH_3SCF_3$: 28.6%, Ar: 71.4%, pressure: 5 Pa, and RF power: 100 W; a Si substrate was treated with the plasma; and a deposit formed on the Si substrate was further treated under conditions of Ar: 100%, pressure: 5 Pa, and RF power: 100 W. The etching rate of the deposit was calculated from the cross-sectional observation results of the sample. The result was the etching rate of the deposit: 2.8 nm/min.

Comparative Example 9

A plasma was generated under conditions of $CH_2F_2$: 28.6%, Ar: 71.4%, pressure: 5 Pa, and RF power: 100 W; and a Si substrate was treated with the plasma. For a deposit formed on the Si substrate, the deposition rate was calculated from the cross-sectional observation results and the compositional analysis by an SEM-EDX was performed. The results were deposition rate: 22.4 nm/min and mass concentrations [%] (C, F, S)=(95.8, 4.2, 0).

A plasma was generated under conditions of $CH_2F_2$: 28.6%, Ar: 71.4%, pressure: 5 Pa, and RF power: 100 W; a Si substrate was treated with the plasma; and a deposit formed on the Si substrate was further treated under conditions of Ar: 100%, pressure: 5 Pa, and RF power: 100 W. The etching rate of the deposit was calculated from the cross-sectional observation results of the sample. The result was the etching rate of the deposit. 1.8 nm/min.

Comparative Example 10

A plasma was generated under conditions of $CH_3F$: 28.6%, Ar: 71.4%, pressure: 5 Pa, and RF power: 100 W; and a Si substrate was treated with the plasma. For a deposit formed on the Si substrate, the deposition rate was calculated from the cross-sectional observation results and the compositional analysis by an SEM-EDX was performed. The results were deposition rate: 24.1 nm/min and mass concentrations [%] (C, F, S)=(98.4, 1.6, 0).

A plasma was generated under conditions of $CH_3F$: 28.6%, Ar: 71.4%, pressure: 5 Pa, and RF power: 100 W; a Si substrate was treated with the plasma; and a deposit formed on the Si substrate was further treated under conditions of Ar: 100%, pressure: 5 Pa, and RF power: 100 W. The etching rate of the deposit was calculated from the cross-sectional observation results of the sample. The result was the etching rate of the deposit. 1.1 nm/min.

Comparative Example 11

A plasma was generated under conditions of $CF_3CH_3$: 28.6%, Ar: 71.4%, pressure: 5 Pa, and RF power: 100 W;

and a Si substrate was treated with the plasma. For a deposit formed on the Si substrate, the deposition rate was calculated from the cross-sectional observation results and the compositional analysis by an SEM-EDX was performed. The results were deposition rate: 24.1 nm/min and mass concentrations [%] (C, F, S)=(93.9, 6.1, 0).

A plasma was generated under conditions of $CF_3CH_3$: 28.6%, Ar: 71.4%, pressure: 5 Pa, and RF power: 100 W; a Si substrate was treated with the plasma; and a deposit formed on the Si substrate was further treated under conditions of Ar: 100%, pressure: 5 Pa, and RF power: 100 W. The physical etching rate of the deposit was calculated from the cross-sectional observation results of the sample. The result was the etching rate of the deposit: 1.0 nm/min.

A Si-based compound reacts with fluorine atoms to form a volatile ($SiF_4$) as in formula:

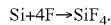

Other reactions also occur as in formulas:

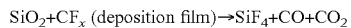

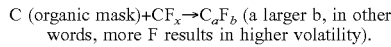

In this case, when more F exists in the reaction system, a highly volatile substance, such as $SiF_4$, is generated in a larger amount. Accordingly, when F content in a deposition film is reduced, the above-mentioned reactions are suppressed, resulting in low reactivity.

Figure 2:
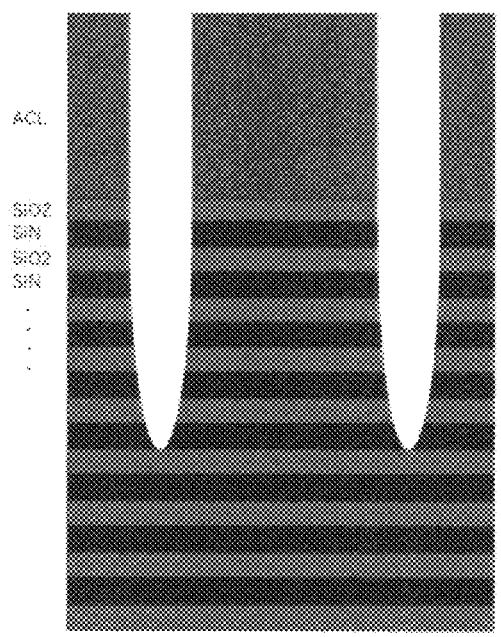
FIG. 2 illustrates a typical 3D-NAND channel hole etching.

The results of Example 4 and Comparative Examples 9 to 11 reveal that a deposition film formed from a plasma containing a gas compound having a thioether skeleton represented by general formula (1) has the deposition rate and the etching rate comparable to common HFC gases. Accordingly, such a gas compound can be used in a similar manner to common HFC. In addition, since the content of F atoms is low in a deposition film, the reactivity between the deposit and a Si-based film is expected to reduce. In comparative experiments using pattern wafers, for example, processing of a particular film in a state in which a plurality of films are exposed is often employed for advanced devices (as in FIGS. 1 and 2). Such a case requires a highly selective process in which a film as a processing target is selectively processed without etching other films as much as possible. Moreover, more than one film is a processing target in some cases (case as in FIG. 2). The etching gases of the present invention can meet such needs by adjusting etching conditions and thus advantageously reduce the number of gases used for producing one device.

INDUSTRIAL APPLICABILITY

By generating a plasma of a gas compound having a thioether skeleton represented by general formula (1) or a mixed gas thereof and using the plasma for etching, it is possible, in processing of a fine structure containing a plurality of Si-based materials, to process only an etching target material selectively over materials other than the etching target and to enhance accuracy in vertical processing of the fine structure. Accordingly, such a gas compound is applicable to high aspect ratio etching of a $SiO_2$/SiN stacked structure in a fabrication process for 3D-NAND or etching of a three-dimensional structure, such as a Fin-FET structure of logic devices.

The invention claimed is:

1. A method of etching a Si-containing film, comprising dry etching a Si-containing film with a gas plasma containing $CH_3$—S—$CF_3$.

2. The method according to claim 1, wherein the Si-containing film is a single-layer film comprising one material containing Si or a multilayer film of stacked two or more materials containing Si.

3. The method according to claim 1, wherein the gas plasma contains, in addition to the compound represented by general formula (1), at least one selected from the group consisting of HF, HCl, HBr, HI, $CF_4$, $CHF_3$, $CH_2F_2$, $CH_3F$, $COF_2$, $C_2F_6$, $C_3F_6$, $C_3F_8$, $C_4F_8$, $C_4F_6$, $C_5F_8$, $NF_3$, and $SF_6$.

4. The method according to claim 1, wherein:
the Si-containing film constitutes, together with a material that is not to be etched, a structure; and
a film that contains S but has F content of 1% or less is deposited on a surface of the structure during etching.

5. The method according to claim 1, wherein the Si-containing film is a film comprising at least one material selected from the group consisting of $SiO_2$, SiN, SiON, SiCN, SiOC, and SiOCN.

6. The method according to claim 4, wherein the material that is not to be etched is at least one selected from the group consisting of an amorphous carbon layer (ACL), spin-on carbon (SOC), TiN, TaN, and photoresists.

7. The method according to claim 1, wherein the gas plasma further contains at least one selected from the group consisting of $N_2$, $O_2$, $O_3$, CO, $CO_2$, COS, $N_2O$, NO, $NO_2$, $SO_2$, and $SO_3$.

8. The method according to claim 1, wherein the gas plasma further contains at least one selected from the group consisting of $H_2$, $NH_3$, and $SiH_4$.

9. The method according to claim 1, wherein the gas plasma further contains at least one selected from the group consisting of He, Ar, Ne, Kr, and Xe.

* * * * *